United States Patent [19]

Genovese et al.

[11] Patent Number: 4,578,615

[45] Date of Patent: Mar. 25, 1986

[54] VACUUM FLUORESCENT PRINTING DEVICE EMPLOYING A FLY'S-EYE LIGHT COUPLING METHOD

[75] Inventors: Frank C. Genovese, Fairport; James W. Lannom, Webster, both of N.Y.

[73] Assignee: Xerox Corporation, Stamford, Conn.

[21] Appl. No.: 605,731

[22] Filed: May 1, 1984

[51] Int. Cl.⁴ .......................... H01J 1/62; H01J 63/06
[52] U.S. Cl. .................... 313/497; 313/110; 340/757; 350/167; 355/3 R; 445/24
[58] Field of Search ............... 313/495, 496, 422, 475, 313/497, 110, 466, 472, 474; 355/3 R, 14 R, 14 CU; 358/256, 258; 340/757, 781; 350/167; 315/169.1; 445/24, 47

[56] References Cited

U.S. PATENT DOCUMENTS

| | | | |
|---|---|---|---|
| 3,641,557 | 2/1972 | Starr | 340/324 A |
| 3,780,326 | 12/1973 | Raaco | 313/108 R |
| 3,784,741 | 1/1974 | Minami | 178/7.88 |
| 4,004,186 | 1/1977 | Bylander | 315/167 |
| 4,041,348 | 8/1977 | Eto et al. | 313/497 |
| 4,047,072 | 9/1977 | Kishino et al. | 313/496 |
| 4,047,074 | 9/1977 | Kishino et al. | 313/497 |
| 4,134,668 | 1/1979 | Coburn | 355/3 R |
| 4,149,147 | 4/1979 | Kishino | 340/760 |
| 4,156,555 | 5/1979 | McMahon | 350/3.75 |
| 4,190,787 | 2/1980 | Kishino et al. | 313/494 |
| 4,270,068 | 5/1981 | Kishino et al. | 313/497 |
| 4,291,341 | 9/1981 | Yajima | 358/300 |
| 4,293,793 | 10/1981 | Kodima et al. | 313/497 |
| 4,298,823 | 11/1981 | Kawasaki et al. | 313/497 |
| 4,314,178 | 2/1982 | Matsuoka | 313/497 |
| 4,472,658 | 9/1984 | Morimoto | 313/497 |

FOREIGN PATENT DOCUMENTS 55-168961  12/1980  Japan .

OTHER PUBLICATIONS

"Fluorescent Display Panel," Futaba Corp. Catalog, (Cover page and inside cover page), 1980 Edition.
Mini-Micro World/Mini-Micro Systems-May 1983, pp. 56, 58, 64.

Primary Examiner—Palmer C. DeMeo
Assistant Examiner—William L. Oen
Attorney, Agent, or Firm—William A. Henry, II

[57] ABSTRACT

A vacuum fluorescent printing device is disclosed having cathode filaments, at least one multiplexed control grid and a skewed matrix of addressable phosphor elements configured on an anode in such a fashion as to enable convenient electrical connection plus imagewise recombination of emitted light from said phosphor elements into a high resolution linear array for the purpose of directing this collection of addressable points of light onto a single line of a photoreceptor drum or belt thereby enabling a xerographic image to be generated. A fly's-eye lens is employed as a light coupling means with the printing device.

12 Claims, 7 Drawing Figures

ZONE/PHASE-PLATE ARRAY

BAFFLE PLATES

FRESNEL PLATE FRONT VIEW   ZONE PLATE SIDE VIEW   PHASE PLATE SIDE VIEW

VACUUM FLUORESCENT PRINTING DEVICE EMPLOYING A FLY'S-EYE LIGHT COUPLING METHOD

Reference is hereby made to copending applications Ser. No. 605,728, entitled "Vacuum Fluorescent Printing Device", Ser. No. 605,729, entitled "Gated Grid Structure for a Vacuum Fluorescent Printing Device", and Ser. No. 605,730, entitled "Edge-Out Matrix Light Bar Coupling Apparatus and Method Using a Fiber-Optics Plate", filed concurrently herewith and incorporated by reference to the extent necessary to practice the present invention.

This invention relates to a printing device for exposing a photosensitive member and, more particularly, to an active light bar which creates precisely controlled marks on a photosensitive member from a digital elecronic bit stream that represents a document of which a copy is desired.

Typical medium-to-high quality electronic printing systems have resolutions of 300 pixels (picture elements) per inch or more. Usually, the resolution or pixel density is the same in both directions on the page, but this is not necessarily the case for all systems. Each bit of the electronic image is mapped to its approximate pixel location on a grid that covers the page and defines the resolution of the system. The size of the mark that is made at each location depends on the particular marking process being used and may be smaller, but is usually larger, than the addressability of the system. For example, a round laser dot with a diameter of 1/300 inch may be used for exposure in a system with addressable elements arranged in a square array of 1/400 inch centers. With a raster scan, the information transfer is continuous, a bit at a time within each scan line being supplied, one line after another in linear succession. However, in principle, the order of mapping pixels is perfectly arbitrary. The choice usually depends wholly on practical considerations.

For an active light bar of a given resolution, the printing speed fixes the maximum time available to make the exposure of the photosensitive member, a 10 inch width processed at 10 inches per second requires a minimum of 3871 ergs/sec or 0.387 milliwatts delivered to its surface. The process time per pixel mapped one-at-a-time at 300×300 per inch is only 111 nanoseconds.

When the system permits many points to be mapped simultaneously, these stringent time restraints are relaxed. Data processed in parallel can be handled by slower, less expensive logic and circuits in general are much easier to design for low speed applications. The average power output of an individual element is reduced significantly when multiple elements can be used in parallel. The greater the number of sources that contribute to the net output, the greater the total available light and the longer the potential life of an individual element.

Various approaches to xerographic reproduction with cathode ray tubes (CRT) are known as well as vacuum fluorescent approaches to displaying character symbols by the use of anodes.

The following disclosures appear to be relevant:
U.S. Pat. No. 3,641,557
Patentee: Starr
Issued: Feb. 8, 1972

Starr discloses a circuit arrangement for modulating the pattern of voltages appearing on a set of electrodes in an electric discharge tube that displays character symbols on the face thereof.

U.S. Pat. No. 3,780,326
Patentee: Raago
Issued: Dec. 18, 1973

Raago discloses an evacuated envelope having a transparent display face which contains a plurality of selectively energizable, phosphor-coated anode display elements for presenting a symbol display, with an auxiliary electrode disposed either behind or coplanar with said display elements and electrically insulated therefrom. A cathode comprising one or more filaments is situated in front of the display elements.

U.S. Pat. No. 4,004,186
Patentee: Bylander
Issued: Jan. 18, 1977

Bylander discloses a vacuum fluorescent display having a grid plate substantially coplanar with an anode and which is controllable with conventional metal oxide semiconductor devices. Each digit of the display includes a segmented anode structure substantially surrounded by a control electrode or grid plate.

U.S. Pat. No. 4,041,348
Patentee: Eto et al.
Issued: Aug. 9, 1977

In Eto et al. a multi-figure fluorescent display tube is disclosed which includes in a casing a plurality of anode display portions formed of segment electrodes each having a fluorescent material layer thereon, cathodes and control electrodes disposed opposite to the anode display portions.

U.S. Pat. No. 4,047,072
Patentee: Kishino et al.
Issued: Sept. 6, 1977

Kishino et al. discloses a multi-column fluorescent display tube having a casing composed of a base plate and a cover plate, multi-column pattern display sections each composed of a plurality of segment anodes with fluorescent material layers thereon provided on the upper surface of the base plate, cathodes provided opposite to the pattern display sections, and electrification preventive layers provided around and in the vicinity of the segment anodes on the base plate and electrically connected to prevent electrification and to intercept an external electric field.

U.S. Pat. No. 4,047,074
Patentee: Kishino et al.
Issued: Sept. 6, 1977

Kishino et al. discloses a multi-column fluorescent display tube having a filament cathode provided opposite to a plurality of fluorescent display sections, which comprises at least a filament damper made of an insulating material low in thermal conductivity and filament damper supporters.

U.S. Pat. No. 4,134,668
Patentee: Coburn
Issued: Jan. 16, 1979

In Coburn, a combined copying and printing apparatus is disclosed that includes a conventional copying apparatus and a non-impact printer that uses a black on white cathode ray tube optical display to form a latent electrostatic image on the photoreceptor of the copier.

U.S. Pat. No. 4,190,787
Patentee: Kishino et al.
Issued: Feb. 26, 1980

Kishino et al. ('787) discloses a phosphorous luminescent display tube of the triode type having, in a vacuum casing, a filamentary cathode for emitting thermions, a controlled electrode for accelerating and controlling the thermions emitted from the cathode, a plurality of pattern display sections each composed of a plurality of segment anodes each coated with a phosphor layer for emitting light when the thermions impinge thereon, and auxiliary anode conductors provided in the vicinity of and substantially on the same level with the segment anodes.

U.S. Pat. No. 4,270,068
Patentee: Kishino et al.
Issued: May 26, 1981

In Kishino et al. ('068) a fluorescent display device is shown having a filamentary cathode for emitting electrons, pattern display sections each coated with fluorescent material, a plurality of control electrodes electrically independent of one another provided opposite to the pattern display sections respectively, the anodes and control electrodes being selectively given drive signals thereby to make the electrons emitted from the filamentary cathode impinge on the anodes as to display characters, and a plurality of auxiliary electrodes provided at or above and in the vicinity of gaps between the control electrodes.

U.S. Pat. No. 4,291,341
Patentee: Yajima
Issued: Sept. 22, 1981

Yajima discloses a copying apparatus that employs an electro-optical converter means in the form of an optical fiber tube.

U.S. Pat. No. 4,293,793
Patentee: Kojima et al.
Issued: Oct. 6, 1981

Kojima et al. discloses a fluorescent display tube in which the electron-stream transmission of a grid electrode is controlled by shielding regions of solid or fine mesh form provided in ech of the grid meshes in opposing relationship to the exposed insulating portions of an anode substrate lying within the corresponding set of anode segments.

U.S. Pat. No. 4,298,823
Patentee: Kawasaki et al.
Issued: Nov. 3, 1981

Kawasaki et al. discloses a fluorescent display device having a grid which is divided into several pieces electrically separated and disposed in close proximity and in an opposed relationship at the edges thereof. The grids are held in position within the display device by an elongated insulator.

In addition, Ricoh's Japanese Laid-Open Patent Application No. 55-168961/1980 filed under the title "Light Emission Recording Tube" discloses a light tube that is used to transmit light to a photosensitive member. Further, in the publication Mini-Micro World/Mini-Micro Systems of May 1983 on pages 56, 58 and 64 a method of imaging with staggered arrays of recording heads is disclosed. All of the above disclosures are included herein by reference to the extent necessary to practice the present invention.

It has been shown that CRT's can be used in several configurations to generate xerographic images. They can be addressed rapidly and emit sufficient light to expose existing photoreceptors even at relatively high speed and still be gated within the available time. However, they are bulky and expensive and require complex support circuitry. The dynamics of electron-beam deflection makes it difficult to produce light patterns that are bright, very high in resolution, exactly rectilinear, and very stable in location, all at the same time.

An invention that alleviates these problems is disclosed in copending U.S. application Ser. No. 605,728, entitled "Vacuum Fluorescent Printing Device" which is incorporated herein by reference. That invention uses a conventional lens as a light transmitting means from either the front or rear of the device. However, a disadvantage in employing this conventional lens to project light is that it is difficult to design and expensive to manufacture a lens having both wide field and high collection efficiency at moderate resolution as is desired.

The optical image bar of the present invention addresses this desire for a device that accomplishes both wide field and high collection efficiency at moderate resolution and includes a uniquely constructed vacuum fluorescent device that is configured in a two dimensional array and comprises controllable light emitting elements that expose a photosensitive member in imagewise configuration in accordance with electronic stimulation. The optical image bar includes a fly's-eye lens light coupling means for transmitting light from the image bar to the photosensitive member.

A preferred feature of the present invention is to provide a small, compact and economical electronically addressable optical active light bar for exposing a photosensitive member and includes an anode substrate on which a fluorescent material is placed and masked in a skewed segment configuration. Also, it should be understood that individual anode segments could be used instead of a uniform anode that is masked for segments if desired. Control grids are placed over the anode to gate emissions from cathode filaments spaced above the grids. A cover plate having a transparent conductive coating on its inside surface and fly's-eye lens array bonded to its outer surface mates with the control grid structure and anode substrate to form a hermetically sealed unit. Electrons emitted from the cathode filaments are gated by the grid structure and excite the masked phosphor-coated anode areas which in turn expose the photosensitive member through the lens array.

Further features and advantages of the invention pertain to the particular apparatus whereby the above-noted aspects of the invention are obtained. Accordingly, the invention will be better understood by reference to the following description, and to the drawings forming a part thereof, which are approximately to scale, wherein.

Figure 1:
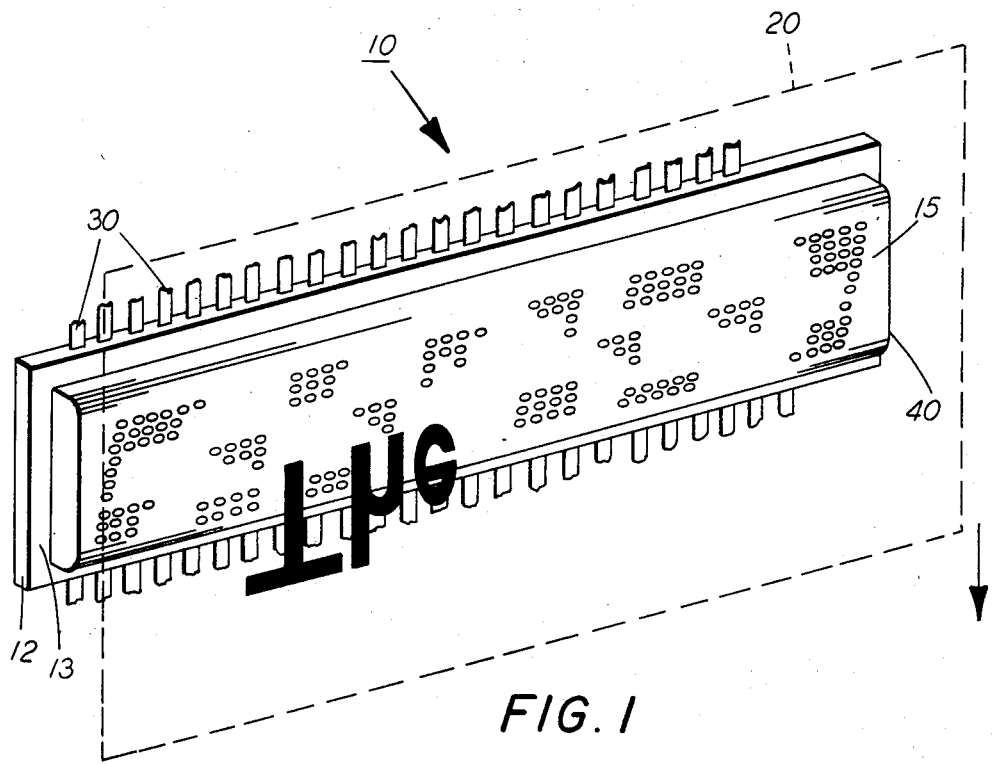
FIG. 1 is an isometric view of the optical image bar of the present invention exposing a photosensitive member.

While the present invention will be described in a preferred embodiment, it will be understood that it is not intended to limit the invention to that embodiment. On the contrary, it is intended to cover all alternatives, modifications and equivalents as may be included within the spirit and scope of the invention as defined by the appended claims.

The device that encompasses the present invention will now be described in detail with reference to the Figures where like reference numerals will be employed throughout to designate identical elements. Although the device for receiving electrical signals and generating an optical output is particularly well adapted for use in a printing machine, it should be evident from the following discussion that it is equally well suited for use in a wide variety of applications and is not necessarily limited to the particular embodiment disclosed.

Figure 3:
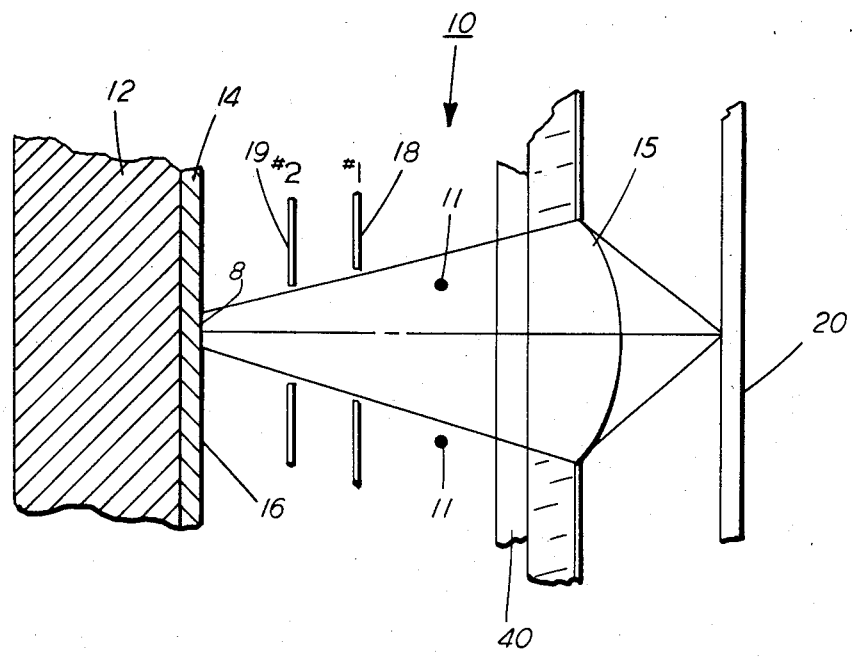
FIG. 3 is a partial elevational schematic view of the image bar of the present invention shown projecting an image through the front of the bar.

Referring now to FIG. 1, a vacuum fluorescent device or optical light printing bar 10 is shown with many controllable light emitting elements 8 that are produced from an anode that is masked by member 16 that has holes 17 in it such that the elements are positioned under an array of fly's-eye lenses 15 in an offset, staggered or skewed array with respect to a vertical plane or the direction of movement of material onto which an image is to be recorded. The light bar is used as an image generating device in conjunction with a light sensitive recording media 20, e.g., photographic film, photoresist, photoreceptors, etc., for the purpose of creating electronically generated images on that medium. Within the printing bar as shown in FIG. 3, electrons emitted from hot filaments 11 are gated by grid structures 18 and 19 to excite phosphor 14 on phosphor-coated anode substrate 12. Above anode substrate 12 are gated grid structures 18 and 19. Grid terminals 30 are connected to a multiplex control circuitry for gating purposes. Cathode filaments 11 are positioned to generate electron emission toward the grid structures when energized. A cover plate 40 having a transparent conductive film on its inside surface is attached to anode substrate 12 in such a manner as to form an air free hermetically sealed unit 10. A high vacuum is maintained through the use of a conventional getter. Therefore, the device of the present invention presents 4096 elements in a 16×256 matrix addressable array, 16 rows and 256 columns (or any equivalent combination and not necessarily rectangular in shape) to cover a photoreceptor or other photosensitive member width of 10.24 inches at a system resolution of 400 pixels per inch. Only 272 control lines spaced on 100 mil centers along both lengthwise sides of the device are required for creating a fluorescent output and these control lines are assembled in a tube envelope of approximately 12 inches in length.

The optical light bar 10 is matrix controlled according to the truth table shown below and functions as a logical AND gate provided the control voltages $G_m$ and $A_n$ swing widely enough. In the table G refers to grids 18 and 19 and A is anode 12.

| TRUTH TABLE | | |
|---|---|---|
| $G_m$ | $A_n$ | OUTPUT$_{m,n}$* |
| low | low | off |
| low | high | off |
| high | low | off |
| high | high | on |

*for example, Grids: −2 volts = low; +2 volts = high
Anodes: 0 volts = low; +50 volts = high This strictly logical behavior provides a distinct advantage over other matrx controlled devices, such as, liquid crystal displays. In those devices, control is based on the sharp voltage threshold of a material property of the light modulating or emitting material that is positioned between the electrical control elements. The state of the material depends only on the voltage difference between the control elements. In the present invention 256 columns are controlled by 256 grids G designed to be driven by relatively low TTL logic (up to 30 volts using ordinary open collector chips, or up to 150 volts using special display-driver chips), operated at low current levels (grid currents are in the microampere range) with a minimum number of connections. The binary number 256 was chosen because it represents a significant reduction in the number of necessary external interconnections leading to a compact package and is a convenient number for the design of the computer controlled drive circuitry. In this grid-anode multiplexing arrangement with the image data presented on the grid column, the 16 rows of anodes are energized sequentially permitting them to emit light under control of the grids. The imaging data, presented at the 256 grids, controls the pattern of electron beam current passing to each anode row in succession. It is the phosphor on the anode which generates the useful light output pattern from the device. Each anode row is energized in succession so that the same 256 grids serve each row one at a time. Since the system has only 16 rows, the associated circuits driving each row can be fabricated from discrete components if necessary permitting, but not necessarily requiring the use of tailored switching circuit designs that can deliver higher voltages and currents than currently available from integrated chips.

Known electronics including conventional buffers and drivers drive optical image bar 10. In operation, a conventional data source such as a computer sends appropriate video data to a multiplex/controller constructed of conventional integrated circuit chips. The controller then sorts the video data input signals with the proper timing, sends the correct signals to a column buffer/driver and to a row decoder also constructed of conventional integrated circuit chips. The row decoder keeps track of which row is active and signals the row buffer/drivers accordingly to deliver the proper row selection potential swing.

Figure 2:
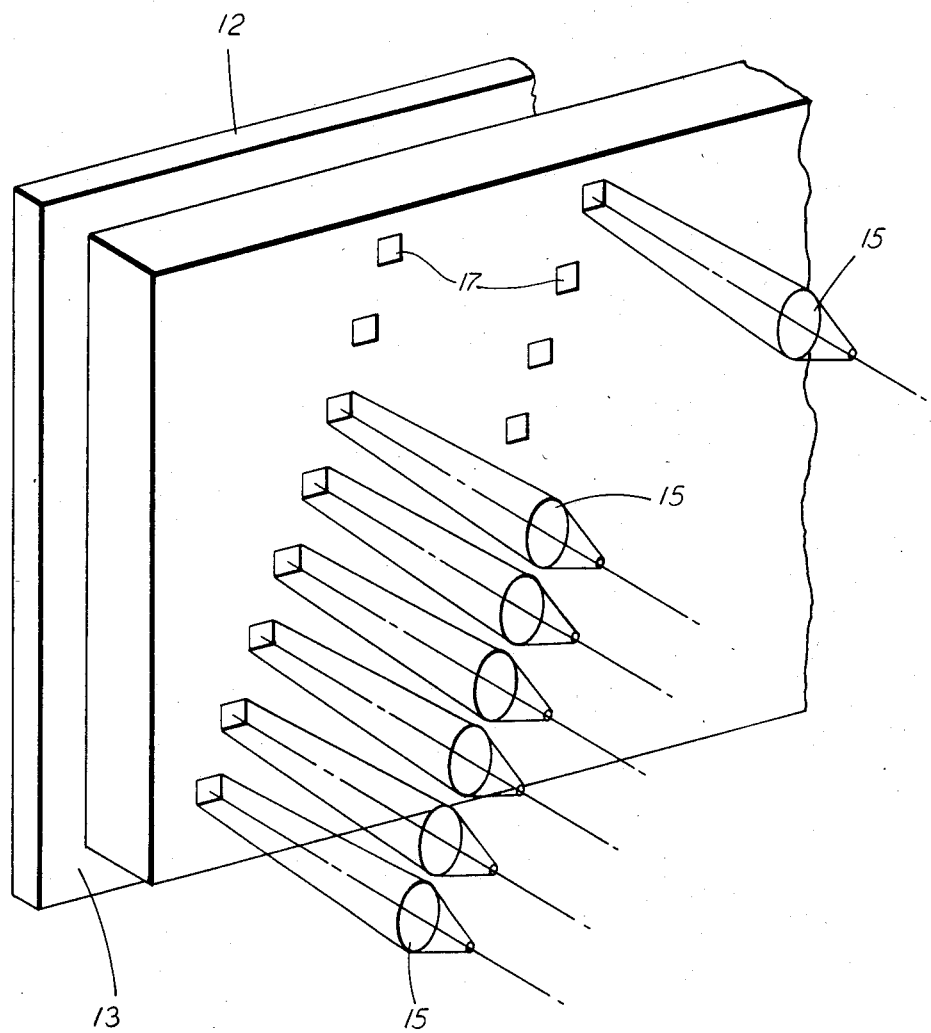
FIG. 2 is a partially exploded isometric view of a small area of the image bar shown in FIG. 1.

A vacuum fluorescent device containing a large number of electronically controllable light sources in some fixed pattern is not by itself sufficient to make a useful print bar apparatus. In conventional vacuum fluorescent tubes, practical considerations limit the closest physical spacing of individually controlled light emitting segments to approximately 15–20 mils. With this limitation, placing all 4096 segments of print bar 100 in a single space at about 400 to the inch is precluded. However, if the segments are arranged in a rectangular array located 40 mils apart in both the X and Y directions forming an active area of 0.60 inches in width and 10.24 inches in length, and the array is included by 40 mils with respect to the direction of photoreceptor motion, the minimum spacing requirements for the anodes as well as the grids and terminals are easily accommodated. Guiding the light output from each seqment to its proper location on photosensitive surface as shown in FIG. 2 is by the improvement of the present invention and comprises a fly's-eye lens array that is molded directly to the cover 40 of the image bag. The fly's-eye lens array has several advantages over conventional lenses including a significant reduction in overall size of the system. Either front or rear projection geometrics can be used. FIG. 1 shows an array of lenses used in the front projection configuration in close proximity to a photosensitive surface.

Figure 4:
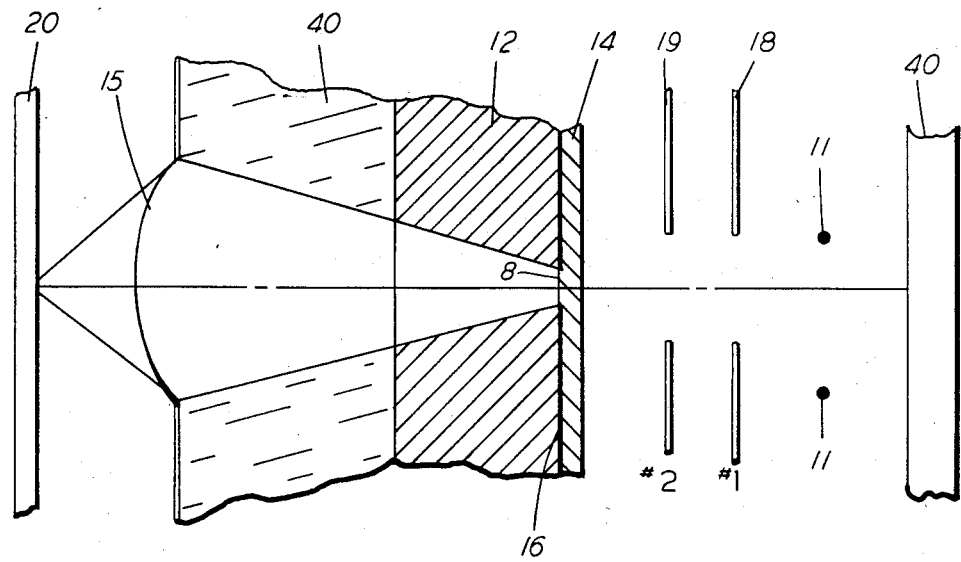
FIG. 4 is a partial elevational schematic of an alternative embodiment of the present optical image bar that projects an image through the rear of the bar.

FIG. 2 is a close-up exploded view of a portion of the device shown in FIG. 1. Each lens operates on axis so that the collection efficiency is maximized with little degradation of image quality. It should be understood that aspherical lens surfaces could be used if desired to improve optical performance. The fly's-eye array is fabricated so that the lenses are centered over the unmasked segments or areas of the anode one-on-one with light baffles stratigically located to prevent crosstalk from any segment through adjacent lenses. The lenses can be molded from plastic and bonded directly to the optical bar in either front or rear projection configurations as shown in FIGS. 3 and 4. Baffles can be formed by lithographic methods on either or both surfaces of the lens array or on the optical bar itself. Alternatively, self-supporting foils or thin flat glass sheets with arrays of etched apertures can be positioned anywhere along the optical axis both inside and outside the vacuum envelope.

Figure 5:
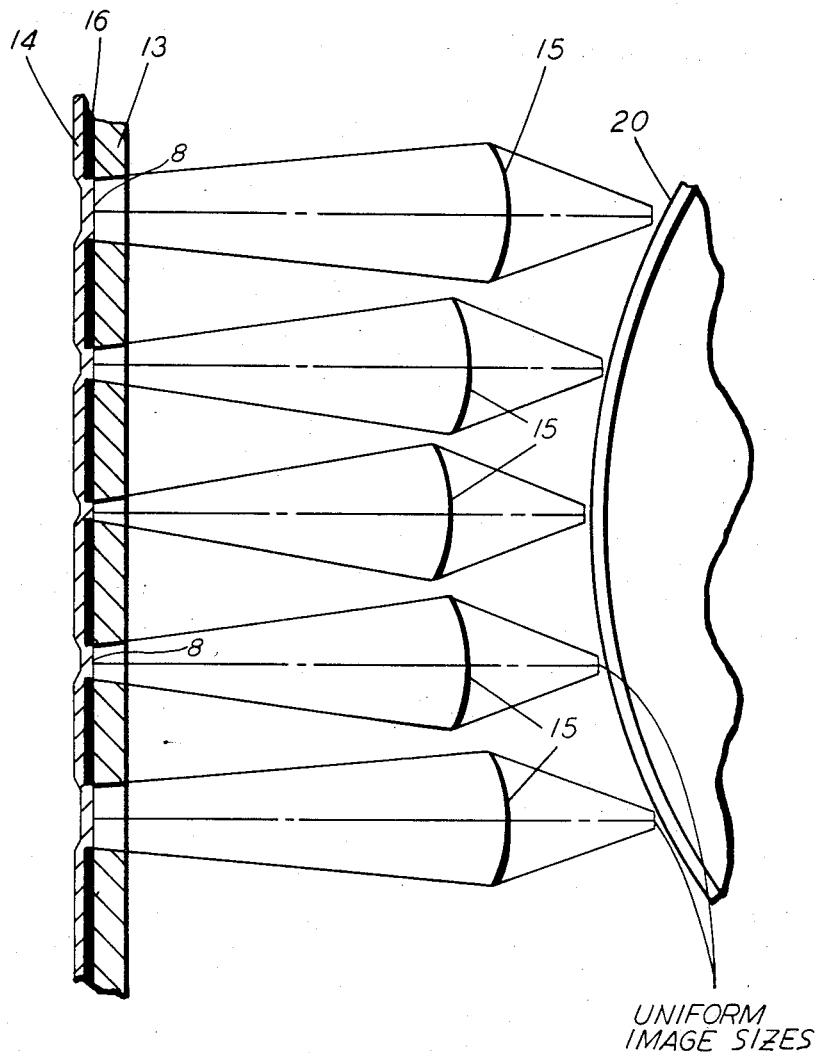
FIG. 5 is an elevational view of a schematic of the optical image bar of the present invention shown in use with a curved surfaced photosensitive member.

Since the system contains 4096 identical optical systems in parallel, each can be tailored for a specific magnification and image plane. For example, by using a lens designed for 4:1 reduction as implied in FIGS. 2, 3, and 4, the object apertures in the image bar can be four (4) times the pixel size regardless of the pixel spacing or pitch of the system. By being bigger than life size, the defining apertures in the bar structure are easier to fabricate to a higher degree of uniformity and statistical variation in brightness from segment to segment because of phosphor graininess is reduced. It also increases the working distance on the device side by a factor of 4. By designing each of the sixteen (16) rows to have a slightly different image distance, the "best image" surface can be made to conform to a drum photoreceptor's cylindrical surface or a belt photoreceptor passing over a guide roller. By compensating the defining aperture size slightly and positioning each row of lenses at the proper object-lens distance, the same lens shape can be used for all rows as shown in FIG. 5. Otherwise, a slightly different lens curvature is needed for each row.

Arrays of fly's-eye lenses have been fabricated that exhibit near diffraction-limited behavior over areas of several mils diameter at f:2 using spherical lenses. This is better than twenty (20) times the resolution necessary for the intended application. Light collection efficiency can be improved by extension to a lower f: number, limited eventually by the index of refraction of the lens material and the maximum space available between lenses.

Figure 6:
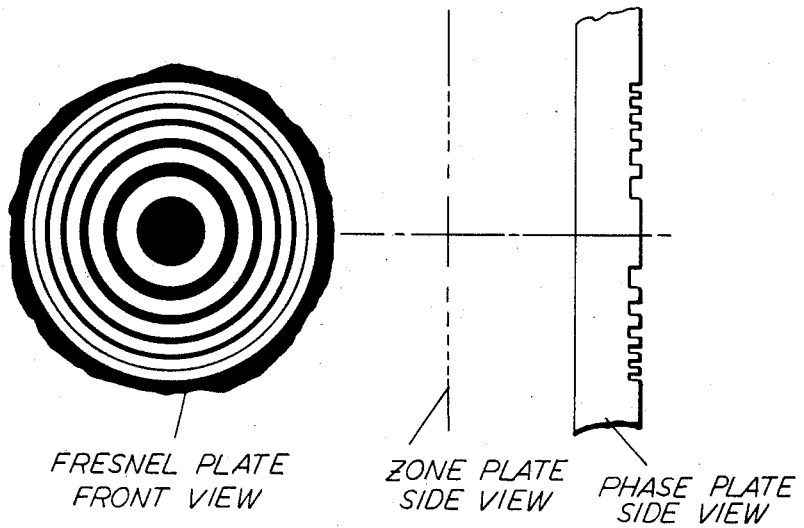
FIG. 6 shows alternative lens arrays for the device of the present invention.
Figure 7:
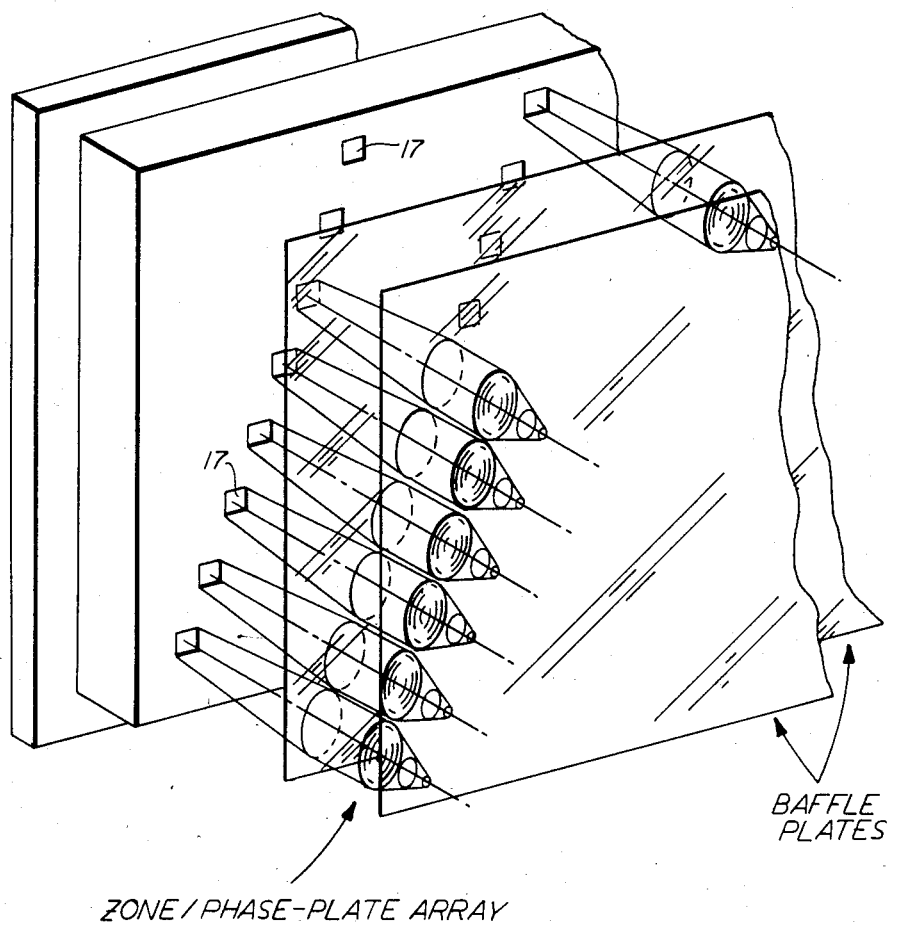
FIG. 7 is an isometric view of the zone/phase plate array of FIG. 6 including light baffles.

Alternatively, a Fresnel lens array or the Fresnel zone and phase plate array shown in FIGS. 6 and 7 could be used as the light coupling means for optical bar 10. The Fresnel lens is a segmented lens (and as such) would be difficult to make on a mass production scale. However, a Fresnel zone or phase plate, diagrammed schematically in FIG. 6, can be made photolithographically from an optical mask generated by step-and-repeat methods. This has the advantage that the positions of photographically identical "lenses" can be very precisely controlled. The master artwork can be generated at many times life-size by computer-aided design methods and reduced photographically to working size. The zone and phase plates can be optimized with the same properties on-axis as the aspheric lens by adjusting the positions of the zones. The difference between a zone and phase plate is that the alternate zones are etched to yield ½ wave retardation in a phase plate, seen in the side view in FIG. 6, whereas they are blocked by opaque material in the zone plate. Although the focusing properties of Fresnel lenses are wavelength dependent, the phosphors to be used in optical bar 10 can be chosen that match the photosensitive medium and emit a relatively narrow band of wavelengths so that they can be considered monochromatic in this application. Photolithographic methods which are ideal for mass production, have been used to make arrays of zone and phase plates with focal lengths less than 100 mils on glass at f:4. The finished Fresnel devices are rugged and the images they form are essentially diffraction limited. In one alternative application, the devices can be formed directly on the optical bar substrate before assembly which would present good registration with the underlying anode segments. To prevent unwanted images created from different diffraction orders, baffles as shown in FIG. 7 are placed between the plane of the zone/phase plate and the image. The Fresnel lens approach is most useful for a relatively sensitive recording media, such as, moderately high speed photographic film.

In conclusion, a fly's-eye matrix light coupling method and apparatus is shown for an optical print bar and includes a lens strip having a molded, phase-array, or zone plate lenslet arrays bonded directly to the optical print bar with baffles and staggering to allow a skewed rectangular array of phosphor sources to address a photosensitive surface and generate a high resolution image with a large number of pixels.

What is claimed is:

1. A vacuum fluorescent printing device adapted for use in conjunction with a moving light sensitive recording media in order to create images from electronically generated data, comprising in combination:
    a plurality of cathode filaments;
    at least one control grid;
    a skewed matrix of addressable phosphor areas arranged on an anode substrate such that as said phosphor sections are excited by said cathode filaments through said control grid a high resolution array of precisely defined light is directed toward said light sensitive recording media; and
    a single curved surfaced fly's-eye lens array adapted to transmit the light from said phosphor areas to said light sensitive recording media, said fly's-eye lens array having lenses that are offset in relation to a vertical plane such that they match said skewed matrix of addressable phosphor areas in order that all points on the surface of said light sensitive recording media can be addressed.

2. The vacuum fluorescent printing device of claim 1, wherein said addressable phosphor areas originate from masking a phosphor surface on said anode substrate.

3. A method of printing digitized image data on a moving photosensitive member, comprising the steps of:
    (a) providing an insulated substrate;
    (b) covering said substrate with a uniform anode;
    (c) covering said anode with a fluorescent substance;
    (d) providing a plurality of heated cathodes spaced from said anode;
    (e) locating a control grid between said cathodes and said anode, said control grid being adapted to allow electrons emitted from said cathodes to pass to selected areas of said anode in response to signals from a source of digitized image data to thereby excite said fluorescent substance on said anode in said selected areas and cause said fluorescent substance to give off light; and
(f) providing a single curved surfaced fly's-eye lens array to receive and transmit the light from said fluorescent substance to said photosensitive member, and wherein lenses of said fly's-eye lens array are offset with respect to a vertical plane to insure complete coverage of the surface of said photosensitive member by light from said fluorescent substance.

4. The method of claim 3, including the step of:
providing an optical mask for said anode so as to precisely define the discrete areas of said anode to be excited.

5. A compact optical active light bar device capable of being electronically addressed for exposing a moving photosensitive member in imagewise configuration, comprising:
filament means for emitting electrons;
control means adjacent said filament means for gating said emissions from said filament means in response to digitized image input;
anode means supported on a substrate and covered by a fluorescent substance such that electrons allowed by said control means to pass to said anode means from said filament means excite said fluorescent substance and causes said fluorescent substance to emit light in the direction of said photosensitive member in order to expose said photosensitive member in imagewise configuration, and wherein said anode means is skewed so that it is positioned in the proper location when imaged on said photosensitive member; and
fly's-eye lens means for providing both wide area coverage and high light collection efficiency in transmitting light from said fluorescent substance to said photosensitive member.

6. The device of claim 5, wherein said fluorescent substance is electroluminescent phosphor.

7. The device of claim 6, wherein said light bar has front and back surfaces and light is emitted from said phosphor substance through said front surface of said light bar.

8. The device of claim 6, wherein said light bar has front and back surfaces and light from said phosphor substance is emitted through said back surface of said light bar.

9. A method of printing digitized image data on a moving photosensitive member, comprising the steps of:
(a) providing a support substrate;
(b) placing anodes in a two-dimensional array on said support substrate;
(c) covering said anodes with a fluorescent substance;
(d) skewing said anodes to position illuminated output from said anodes;
(e) providing a plurality of heated cathodes spaced from and facing said anodes;
(f) locating a grid between said cathodes and said anodes, said grid being adapted to allow electrons emitted from said cathodes to pass to said anodes in response to signals from a source of digitized image data to thereby excite said fluorescent substance on said anodes which in turn exposes said photosensitive member; and
(g) providing a single curved surfaced fly's-eye lens array for transmitting light from said fluorescent substance to said photosensitive member with both wide area coverage and high collection efficiency.

10. The method of claim 9, including the step of:
masking said anodes to more precisely define the light output area of said fluorescent substance.

11. A method of printing digitized image data on a photosensitive member in motion, comprising the steps of:
(a) providing an insulated substrate;
(b) covering said substrate with a uniform anode;
(c) covering said anode with a fluorescent substance;
(d) providing a plurality of heated cathodes spaced from said anode;
(e) locating a control grid between said cathodes and said anode, said control grid being adapted to allow electrons emitted from said cathodes to pass to selected areas of said anode in response to signals from a source of digitized image data to thereby excite said fluorescent substance on said anode in said selected areas and cause said fluorescent substances to give off light; and
(f) providing a Fresnel lens array to receive and transmit the light from said fluorescent substance to said photosensitive member.

12. A method of printing digitized image data on a photosensitive member in motion, comprising the steps of:
(a) providing an insulated substrate;
(b) covering said substrate with a uniform anode;
(c) covering said anode with a fluorescent substance;
(d) providing a plurality of heated cathodes spaced from said anode;
(e) locating a control grid between said cathodes and said anode, said control grid being adapted to allow electrons emitted from said cathodes to pass to selected areas of said anode in response to signals from a source of digitized image data to thereby excite said fluorescent substance on said anode in said selected areas and cause said fluorescent substance to give off light; and
(f) providing a Fresnel zone and phase plate array to receive and transmit the light from said fluorescent substance to said photosensitive member.

* * * * *